United States Patent
Andrews et al.

(10) Patent No.: US 7,034,596 B2
(45) Date of Patent: Apr. 25, 2006

(54) ADAPTIVE INPUT LOGIC FOR PHASE ADJUSTMENTS

(75) Inventors: William B. Andrews, Emmaus, PA (US); Harold Scholz, Allentown, PA (US); Barry K. Britton, Orefield, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 10/365,083

(22) Filed: Feb. 11, 2003

(65) Prior Publication Data

US 2004/0155690 A1      Aug. 12, 2004

(51) Int. Cl.
*H03K 3/00*      (2006.01)
(52) U.S. Cl. .................. 327/257; 327/258; 327/259
(58) Field of Classification Search ............... 327/263, 327/264, 269, 270, 272, 276, 277, 392, 393, 327/395, 400, 279; 326/93, 86; 365/551; 375/354
See application file for complete search history.

(56) References Cited

U.S. PATENT DOCUMENTS

| | | | | |
|---|---|---|---|---|
| 5,457,718 A * | 10/1995 | Anderson et al. | ............ | 375/373 |
| 5,515,403 A * | 5/1996 | Sloan et al. | ................ | 375/371 |
| 5,778,214 A * | 7/1998 | Taya et al. | .................. | 713/400 |
| 6,407,583 B1 * | 6/2002 | Saito | ............................ | 326/93 |
| 6,491,634 B1 * | 12/2002 | Leavitt et al. | .............. | 600/447 |
| 6,628,154 B1 * | 9/2003 | Fiscus | ......................... | 327/158 |
| 6,765,973 B1 * | 7/2004 | Miller et al. | ................. | 375/354 |

* cited by examiner

*Primary Examiner*—Tuan T. Lam
*Assistant Examiner*—Hiep Nguyen
(74) *Attorney, Agent, or Firm*—MacPherson Kwok Chen & Heid LLP; Greg J. Michelson

(57) ABSTRACT

Systems and methods are disclosed to provide static and/or dynamic phase adjustments to a data signal relative to a clock signal. For example, the data signal may be delayed by a coarse delay and/or a fine delay to match the timing of the clock signal independently for each input path (e.g., per input pad). The delay may be as a function of positive and/or negative clock edges.

22 Claims, 12 Drawing Sheets

STAY = (!QUP ·!QDN) + !RUN + !AUTO
MV = LDEL + MDEL
UPDNN = (QUP· !QDN) + (QUP · QDN· LASTMV)

ADAPTIVE INPUT LOGIC FOR PHASE ADJUSTMENTS

TECHNICAL FIELD

The present invention relates generally to electrical circuits and, more particularly, to adaptive input logic for performing phase adjustments.

BACKGROUND

As integrated circuits increase in density and complexity and are required to meet more stringent, diverse, and higher-speed input/output (I/O) interface standards, clock and data timing management becomes an important design consideration. Typically, a phase-locked loop (PLL) or a delay-locked loop (DLL) is employed to provide clock management and attempt to minimize timing issues such as clock skew, clock delay, and clock jitter.

In general, the PLL monitors and locks onto a reference signal, such as a system clock, to manage or synthesize various clock signals. The DLL also monitors and locks onto a reference signal (e.g., a system clock), but utilizes a delay line rather than a voltage controlled oscillator, to manage and provide the clock management function. A drawback of these types of systems is that the PLL and DLL methods often involve the generation of numerous clock signals and routing structures (e.g., a PLL or a DLL and associated clock distribution network for each type of I/O interface standard being supported), which is inefficient and consumes valuable circuit area and may result in difficult layout constraints. As a result, there is a need for an improved technique for managing clock and data timing relationships.

SUMMARY

Systems and methods are disclosed herein for providing adaptive logic for dynamic and static phase adjustments for clock and data relationships. For example, in accordance with one embodiment of the present invention, input data is delayed by a coarse delay amount and a fine delay amount prior to receipt by data capture elements so as to match the timing of a clock received by the data capture elements. Furthermore, in accordance with one or more embodiments of the present invention, the input data delay may be statically and/or dynamically adjusted as a function of positive and/or negative clock edges on an individual input data basis (e.g., for each associated input pad). Consequently, by utilizing techniques discussed herein, conventional PLL and DLL circuits are not required to provide proper clock and data timing relationships.

In accordance with one embodiment of the present invention, a circuit includes a delay circuit adapted to receive a first signal and apply a selectable delay to the first signal to provide a delayed first signal having a timing relationship relative to a clock signal; and a first register, coupled to the delay circuit, adapted to receive the delayed first signal and the clock signal and store the delayed first signal based upon a timing of the clock signal.

In accordance with one embodiment of the present invention, an integrated circuit includes means for delaying an input signal to provide a plurality of delayed versions of the input signal with each having a different amount of delay applied; means for storing the plurality of delayed versions of the input signal relative to a clock signal; and means for controlling an amount of delay applied by the delaying means and determining which of the plurality of delayed versions of the input signal within the storing means to provide as an output signal.

In accordance with another embodiment of the present invention, a method of controlling a timing relationship between an input signal and a clock signal includes receiving the input signal; delaying the input signal and providing a delayed version of the input signal; storing the delayed version of the input signal; and controlling an amount of delay applied to the input signal relative to a timing of the clock signal.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

The preferred embodiments of the present invention and their advantages are best understood by referring to the detailed description that follows. It should be appreciated that like reference numerals are used to identify like elements illustrated in one or more of the figures.

DETAILED DESCRIPTION

Figure 1:
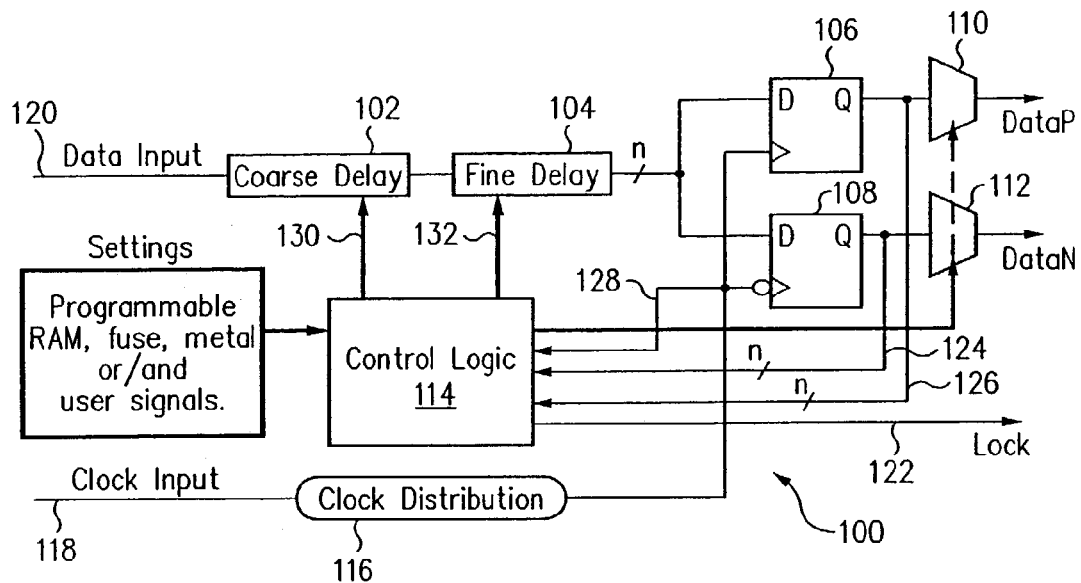
FIG. 1 shows a block diagram illustrating adaptive input logic in accordance with an embodiment of the present invention.

FIG. 1 shows a block diagram illustrating an adaptive input logic 100 in accordance with an embodiment of the present invention. Adaptive input logic 100 is a block diagram of a circuit that may be formed as part of an integrated circuit, such as a programmable logic device (e.g., a field programmable gate array (FPGA) or a complex programmable logic device (CPLD)) or incorporated into a design of an application specific integrated circuit (ASIC), to maintain data timing relationships relative to a clock.

For example, adaptive input logic 100 may be implemented as part of an FPGA input buffer to provide the necessary management (e.g., logic) to capture data from input pads, while maintaining desired data/clock timing requirements. Adaptive input logic 100 adjusts a delay of input data (e.g., on an individual pad basis), to compensate for timing issues, such as skew between the input clock and the input data. As explained in further detail herein, the timing relationship between the input clock and the input data may be monitored and maintained for the positive and/or the negative clock edges, such as for single data rate (SDR) and double data rate (DDR) applications.

Adaptive input logic 100 includes a coarse delay 102, a fine delay 104, registers 106 and 108, multiplexers 110 and 112, and control logic 114. Coarse delay 102 receives a data signal on a data input lead 120 and provides a coarse delay adjustment (i.e., a timing delay) to the data signal, which is followed by fine delay 104 providing a fine delay adjustment to the data signal. The amount of delay applied to the data signal by coarse delay 102 and fine delay 104 is determined by control logic 114 via a coarse delay control signal and a fine delay control signal on respective leads 130 and 132 (where lead used herein may represent one or more signal paths, including a bus structure). The data signal is then stored in registers 106 and 108 (also referred to as input data capture elements) prior to being selectively read out by corresponding multiplexers 110 and 112 under control of control logic 114.

The data signal (e.g., from an input pad of the integrated circuit) is delayed prior to reaching registers 106 and 108 to match a phase of a clock signal (on a clock input lead 118) received by registers 106 and 108. For example, the data signal may be delayed (i.e., by coarse delay 102 and fine delay 104) to match the delay (or meet a minimum phase relationship) of the clock signal resulting from the propagation time of the path of the clock signal from an input pad, through a clock distribution network 116, to registers 106 and 108. Clock distribution network 116 may represent one type of clock routing structure or may represent a flexible clock routing structure that may be configured (e.g., programmed) into a number of custom routing configurations.

Coarse delay 102 and fine delay 104 function to provide maximum flexibility for the amount of delay applied to the data signal. However, certain applications may only require coarse delay 102 or fine delay 104, such as when supporting only a limited number of similar I/O interface standards or where the clock signal and the data signal paths are well matched.

Coarse delay 102 is utilized, for example, to match the delay of the data signal to the type of clock distribution network 116 at a specific environment setting (e.g., for expected process, voltage, and temperature (PVT) conditions). Fine delay 104 is utilized, for example, to compensate for a range of conditions, including for example a change in PVT conditions, system noise, skew variations of the data signal relative to the clock signal, and jitter effects, and statically and/or continuously adjust the delay of the data signal within a range centered around the setting of coarse delay 102. Thus, coarse delay 102 provides a coarse delay setting based upon expected conditions, while fine delay 104 provides an additional fine delay setting to fine tune the amount of delay of the data signal relative to the clock signal.

Control logic 114 monitors the clock signal at registers 106 and 108 (i.e., from a lead 128) and output signals from registers 106 and 108 (i.e., from corresponding leads 126 and 124) and determines the amount of delay to be applied by coarse delay 102 and fine delay 104. For example, control logic 114 may be employed to maintain a programmable phase relationship between the clock signal and the data signal. Control logic 114 may also provide a lock signal (on a lead 122) when the timing relationship of the data signal relative to the clock signal is within desired (e.g., programmable) specifications for a given period of time, as explained in further detail herein.

Control logic 114 may be programmed or commanded by control signals to control various settings (e.g., features or parameters) of adaptive input logic 100, which includes the timing relationship of the data signal relative to the clock signal. These settings may be set or programmed for example by memory (e.g., programmable random access memory (RAM) or static RAM (SRAM) as is typically found in a PLD), a programmable fuse, hard-wired (e.g., a metal layer within an ASIC), and/or by user provided control signals received by control logic 114.

As an example, these setting may include a clock/data margin, a delay range, a bit swapping, a register reset, a dynamic adjustment option, a run setting, and a logic reset. The clock/data margin sets the amount of delay margin permitted between data edges and clock edges. The delay range sets the range of delay permitted (e.g., from a narrow delay range to a wide delay range). The bit swapping provides the ability for the programmed delay, when reaching its maximum or minimum setting, to wrap around to the opposite setting.

The register reset provides the capability of synchronously resetting control logic 114 when resetting registers 106 and 108. The dynamic adjustment option provides an on/off setting for dynamic delays, where for example the on setting permits control logic 114 to dynamically adjust (i.e., continuous or periodic) the amount of delay provided by coarse delay 102 and/or fine delay 104, while the off setting forces control logic 114 to maintain the static delay settings for coarse delay 102 and/or fine delay 104.

The run setting, when the dynamic adjustment option is set to allow dynamic delay adjustments, controls whether dynamic adjustments are performed. For example, if the run setting is asserted, then dynamic delay adjustments are allowed to occur, while if the run setting is not asserted, then dynamic delay adjustments are prevented (i.e., the current delay setting is not changed). The logic reset allows for an asynchronous reset or a synchronous reset.

Figure 2:
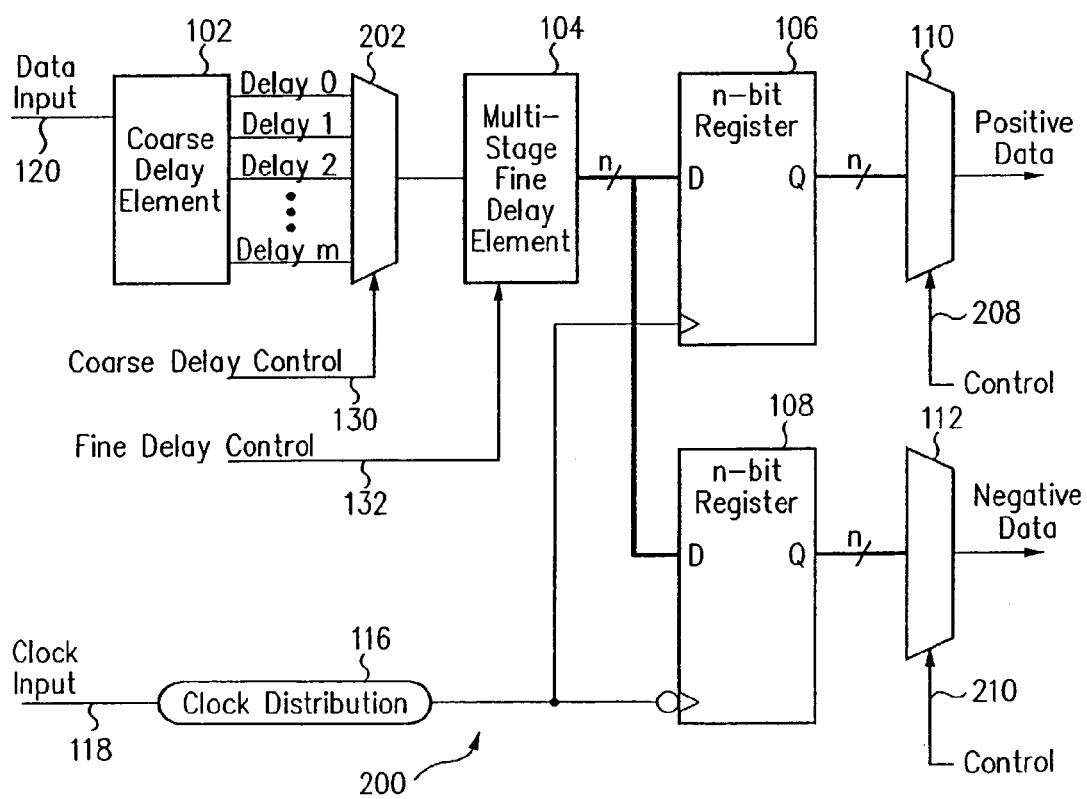
FIG. 2 shows a block diagram illustrating an exemplary implementation of an input data delay structure for a portion of the adaptive input logic in accordance with an embodiment of the present invention.

FIG. 2 shows a block diagram illustrating an exemplary implementation and application of an input data delay structure (IIDS) 200 for a portion of adaptive input logic 100 in accordance with an embodiment of the present invention. This exemplary implementation provides additional details for a data signal path, while additional details for an exemplary implementation of control logic 114 is described in reference to FIG. 3.

As shown in FIG. 2, coarse delay 102 receives the data signal on lead 120 and applies a coarse delay that approximately matches a clock delay (e.g., injection time) of the clock signal on lead 128, for example, from an input pad via lead 118, through clock distribution network 116, to registers 106 and 108. Clock distribution network 116, as noted above, may represent numerous types of different clock distribution structures, such as found in a PLD, to meet the various clocking requirements that may be desired by a user's design. Therefore, coarse delay 102 provides various selectable delays to match the delay corresponding to a selected clock distribution structure of clock distribution network 116.

The delay of the data signal, for example, may be adjusted to meet a minimum amount of margin for data setup and/or hold times at registers 106 and 108 (i.e., the input capture elements). The amount of margin is programmable by a user to adjust for different I/O interface standards (e.g., various specifications, such as frequency or data rate). The total amount of delay adjustment is also programmable or the input delay can be programmed to be a specific static delay.

The amount of coarse delay, if any, applied by coarse delay 102 is determined by coarse delay control signal on lead 130 provided by control logic 114 (FIG. 1). Control logic 114 may represent, for example, a microprocessor or a microcontroller or logic circuits as described in reference to FIG. 3. The coarse delay control signal controls a multiplexer 202 to select the appropriate amount of delay applied to the data signal. The amount of delay may be selected by representative delays of a delay 0, a delay 1, a delay 2, ..., through a delay m, where the delay 0 represents a minimum delay or no delay and the delay m represents a maximum amount of delay, with "m" plus one being the number of delay choices available.

The data signal may also be delayed by fine delay 104, as described above, to provide a smaller increment of delay than is available from coarse delay 102 (e.g., to adjust for physical and surrounding environmental conditions). The amount of delay applied by fine delay 104 is controlled by fine delay control signal on lead 132 from control logic 114. For example, fine delay 104 may include a multi-stage delay element, with the amount of delay selectable by the fine delay control signal. The multi-stage delay element may include "n" stages, with each element stage having a different delay adjustment range and control settings and providing the data signal with a corresponding delay. As another example, the multi-stage delay element may include "n" stages, which may programmably select from a narrow range of delay or from a wider range of delay.

Figure 4A:
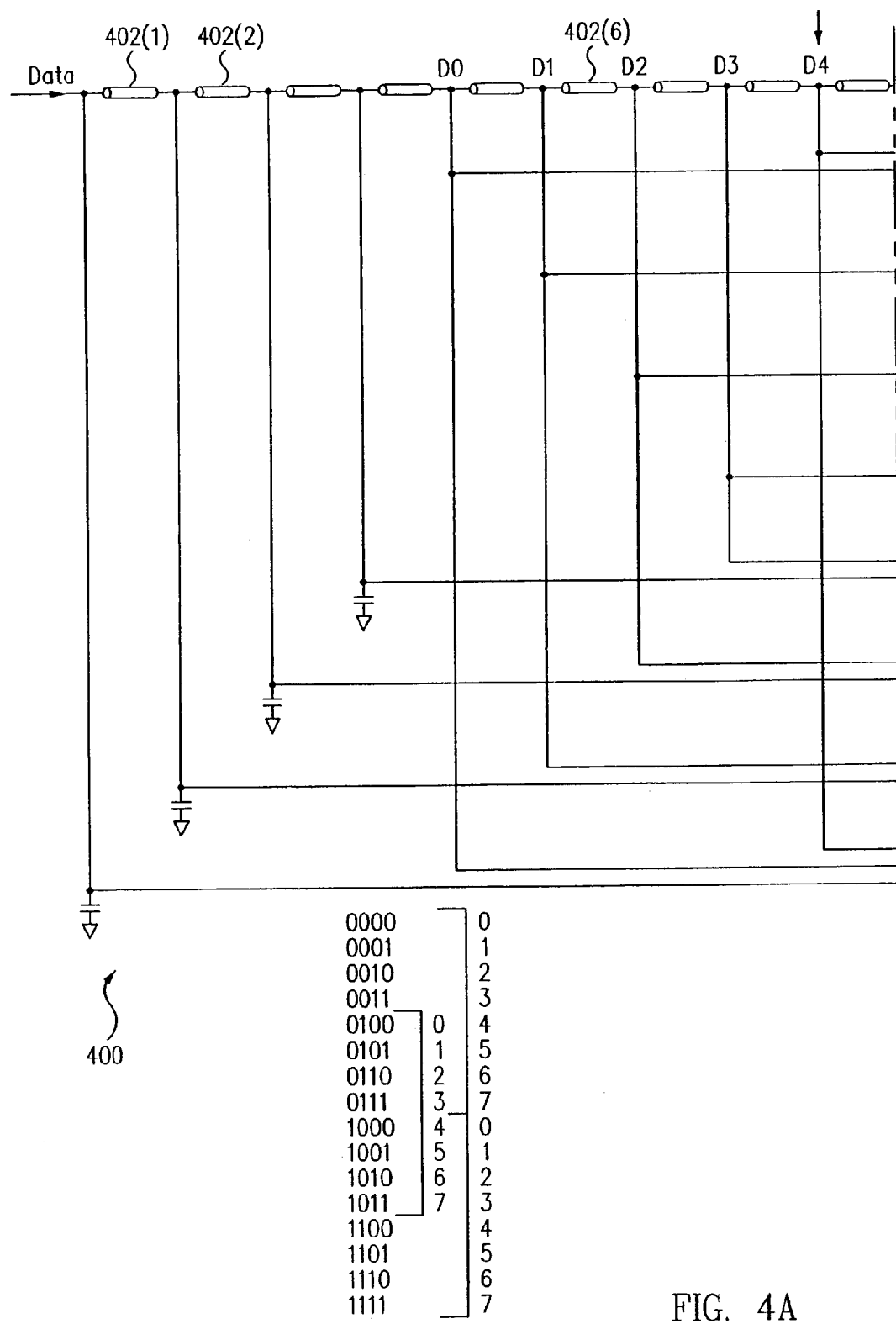
FIG. 4 shows an exemplary circuit implementation for a fine delay portion of the adaptive input logic in accordance with an embodiment of the present invention.
Figure 4B:
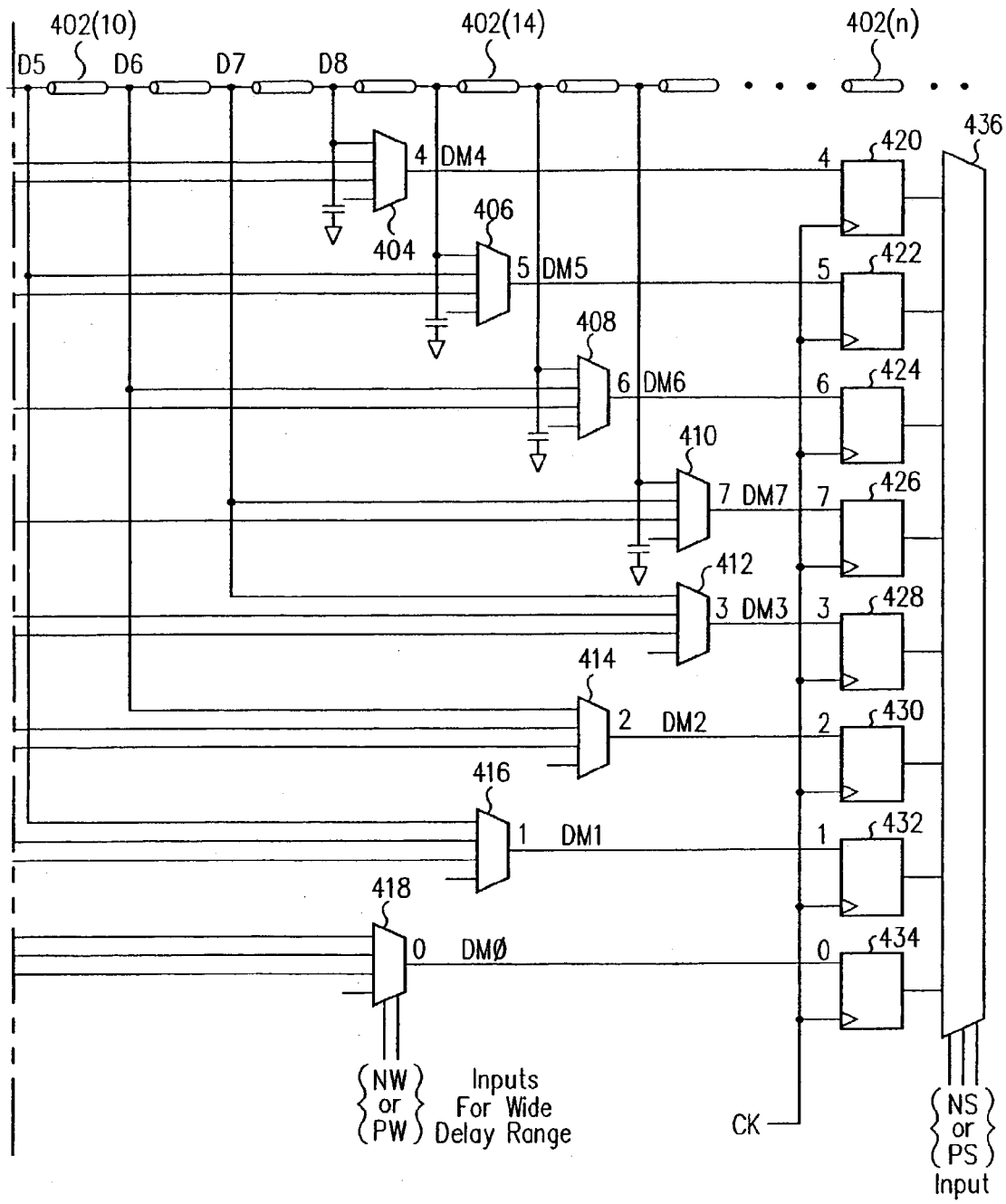

As an example, FIG. 4 shows an exemplary circuit implementation for fine delay 104 of adaptive input logic 100 in accordance with an embodiment of the present invention. As shown in FIG. 4, the data signal (labeled data) is received by a plurality of delay elements 402 (which are separately referenced as delay elements 402(1), 402(2), ... through 402(n), where "n" represents the number of delay elements 402). Delay elements 402 may each represent a pair of inverters or any other type of delay element to provide a delay to the data signal.

Multiplexers 404 through 418 select from a number of taps among delay elements 402, as shown, to provide a corresponding output signal to registers 420 through 434. A multiplexer 436 selects via an NS or a PS control signal, which of registers 420 through 434 to utilize to provide a delayed version of the data signal. The range of delay available may be viewed as a narrow range, where only one of the plurality of inputs to multiplexers 404 through 418 are utilized, or as a wide range, where all of the plurality of inputs to multiplexers 404 through 418 are utilized. The narrow range or the wide range of delay may be controlled by an NW control signal or a PW control signal. Thus, for the wide delay, the amount of delay shifts by groups of four of delay elements 402, to vary the available amount of delay that can be provided to the data signal.

Coarse delay 102 may be implemented in a similar fashion as is shown in FIG. 4 for fine delay 104. Alternatively, coarse delay 102 may be a delay chain (e.g., a chain of inverters) providing a selectable delay to the data signal.

Returning to FIG. 2, fine delay 104 provides "n" different delayed versions of the data signal to registers 106 and 108, which are n-bit registers. For example, the "n" different delayed versions of the data signal, provided by fine delay 104, are captured by corresponding bits within register 106 and/or register 108. Register 106 may be utilized to capture data associated with a positive edge of the clock signal (i.e., referred to as DataP or Positive Data in FIGS. 1 and 2, respectively), while register 108 may be utilized to capture data associated with a negative edge of the clock signal (i.e., referred to as DataN or Negative Data in FIGS. 1 and 2, respectively). Thus, registers 106 and 108 would be utilized for DDR applications, while only register 106 or register 108 would be utilized for SDR applications (depending upon whether the data signal for the SDR application is clocked on the positive or negative clock edge of the clock signal).

In general, control logic 114 determines which register bit from registers 106 and/or 108 will be utilized to provide the data signal. For example, a control signal on a lead 208 and a control signal on a lead 210, provided by control logic 114 to corresponding multiplexers 110 and 112, select which register bit from corresponding registers 106 and 108 is utilized to provide the data signal (labeled Positive Data and Negative Data, respectively, in FIG. 2).

Control logic 114 may also monitor output signals from registers 106 and 108 (on leads 126 and 124, respectively, as shown in FIG. 1) and determine the proximity of any data edges to clock edges for each register bit. Control logic 114 may reselect which register bit from registers 106 and/or 108 will be utilized to provide the data signal if a series of data bits are determined to be too close to a clock edge for the currently selected register bit used to provide the data signal via multiplexer 110 and/or multiplexer 112.

Figure 3:
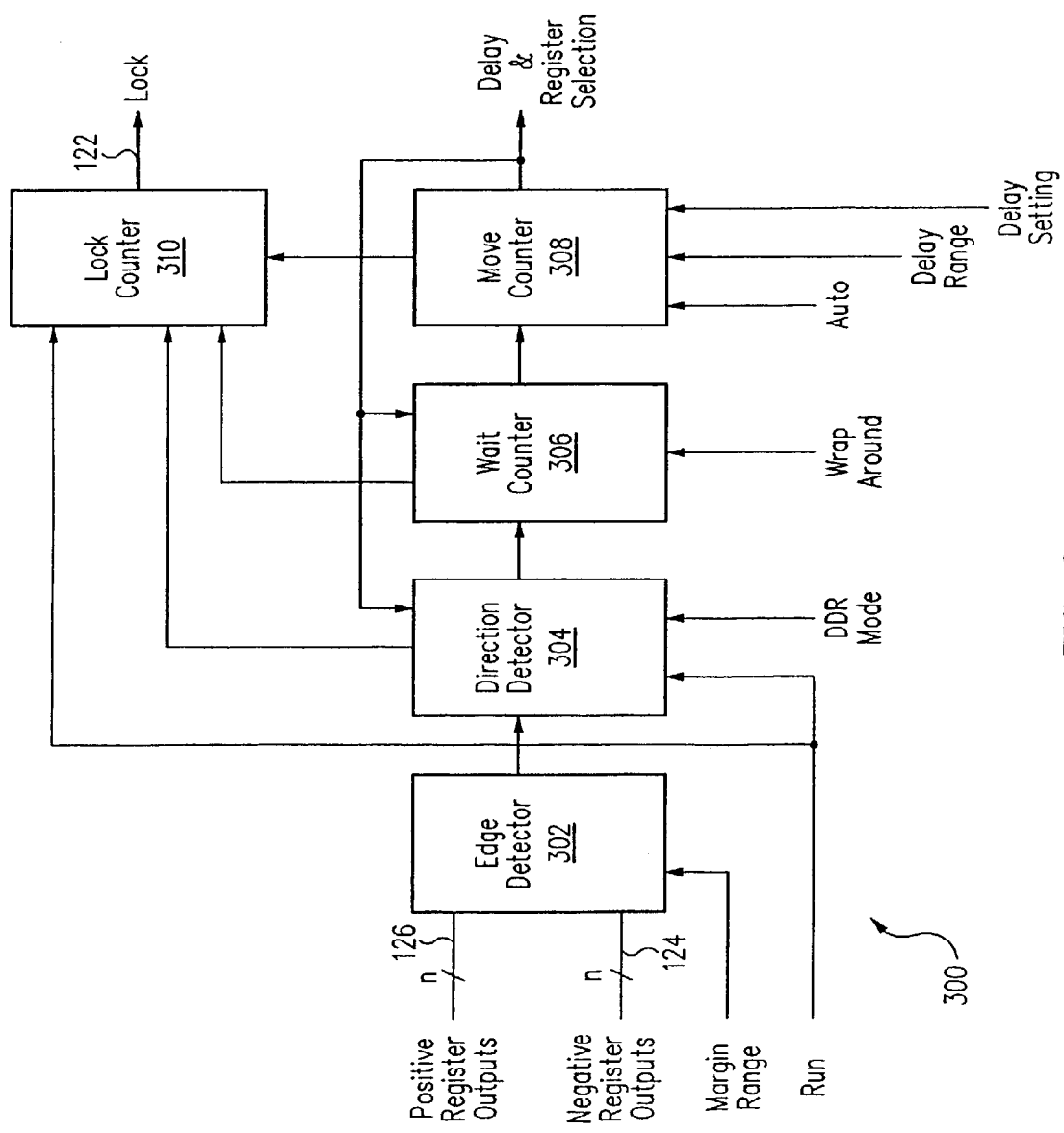
FIG. 3 shows a block diagram illustrating an exemplary implementation of control logic for the adaptive input logic in accordance with an embodiment of the present invention.

FIG. 3 shows a block diagram of control logic 300, which illustrates an exemplary implementation of control logic 114 for adaptive input logic 100 in accordance with an embodiment of the present invention. Control logic 300 includes an edge detector 302, a direction detector 304, a wait counter 306, a move counter 308, and a lock counter 310.

Edge detector 302 monitors the output signals from registers 106 and 108 (e.g., the positive and negative data registers) on corresponding leads 126 and 124 to determine the relative location of a data transition to a clock edge for all of the register bits from registers 106 and 108. A margin range signal (e.g., a digital signal) is provided to edge detector 302 to set or control the distance from a clock edge to search for a data transition.

Direction detector 304 determines the relative position of data transitions to the currently selected register bit. Direction detector 304 provides an output signal to wait counter 306 to increase, decrease, or not change the current register bit selected. A run signal is provided to direction detector 304, which for example when asserted allows direction detector 304 to change the selected register bit, but when not asserted prevents direction detector 304 from changing which register bit is selected to provide the data signal. A DDR mode signal is also provided to direction detector 304, which indicates whether the data signal being received is SDR or DDR (i.e., whether only one or both of registers 106 and 108 are to be monitored).

Direction detector 304 may also retain knowledge regarding one or more of its previous direction commands provided on the output signal as to whether to increase, decrease, or not change the current register bit selected. This knowledge (e.g., stored in memory) assists direction detector 304 in making a more intelligent decision as to whether to command a change of the selected register bit.

For example, if the current register bit selected is in a close timing relationship to a clock edge that is experiencing jitter, direction detector 304 may view the clock edge on one side and then the other side of the selected register bit from one determination to the next. Consequently, direction detector 304 may issue a command to, for example, increase to the next register bit to move away from the clock edge, while due to the jitter would issue a following command to decrease to a lower register bit. Therefore, direction detector 304 may fail to move out of the jitter area near the clock edge. By knowing which direction was chosen on the last command by direction detector 304, direction detector 304 may, for example, continue to choose to move in that same direction to escape the jitter area of the clock signal (i.e., until the selected register bit for the data signal is clear of the jitter area of the clock signal).

Wait counter 306 is utilized to allow a buffering of time between instructions from direction detector 304 and the time control logic 300 selects the new data register positions of registers 106 and 108 to provide the data signal. Wait counter 306 waits for a minimum number of instructions from direction detector 304 prior to moving in a desired direction, where the amount of time to wait can be selectable (e.g., controlled by an input signal or programmable). An output signal (e.g., an instruction) is provided from wait counter 306 to move counter 308 to change the selected register bit, which therefore results in an increase or a decrease in the amount of delay applied to the data signal (i.e., each register bit corresponds to a different amount of delay).

A wrap around signal is received by wait counter 306. If the wrap around signal is asserted, wait counter 306 will allow move counter 308, when it reaches a maximum or a minimum amount of delay, to wrap around to the opposite extreme delay setting (i.e., from a maximum amount of delay to a minimum amount of delay or vice versa). If the wrap around signal is not asserted, wait counter 306 will prevent move counter 308 from wrapping around.

Move counter 308 selects the register bit with the correct amount of delay applied to properly capture the data signal. A delay range signal, received by move counter 308, sets the limits or delay range that can be set or adjusted for the total amount of delay, with the delay range being any number of register bits. For example, the delay range signal sets the amount of total delay. If a data edge begins to encroach into this margin, then move counter 308 selects a different register bit to maintain the margin. A delay setting signal, received by move counter 308, sets the amount of static delay to be applied to the data signal (e.g., if not dynamically adjusting) or may provide an initial value to start with if dynamic adjustments are permitted.

An auto signal, received by move counter 308, when asserted allows control logic 300 to adjust the input delay applied to the data signal and register bit selection as a function of the data signal and the clock signal relationship (i.e., dynamic adjustments). When the auto signal is not asserted, the input delay applied to the data signal is set by a fixed delay setting (i.e., static adjustment). Move counter 308 provides delay and register selection signals to control the amount of delay applied to the data signal and to select a specific register bit from multiplexers 110 and 112 (e.g., controls the coarse delay control signal to multiplexer 202 and the fine delay control signal to fine delay 104 and controls multiplexer 110 and 112).

Lock counter 310 monitors direction detector 304, wait counter 306, and move counter 308, along with the run signal, and generates the lock signal (e.g., a flag signal on lead 122) when a minimum amount of margin has been met for a minimum amount of time. The amount of time and margin may be selectable by a user.

For example, lock counter 310 monitors direction detector 304 and asserts the lock signal if no requested change in the register bit is made for a certain period of time. Once the lock signal is asserted, the lock signal may remain asserted even if a change in the selected register bit is performed (i.e., to maintain desired margins). Lock counter 310 may lose lock (i.e., de-assert the lock signal) if a reset occurs or if bit swapping occurs.

Figure 5A:
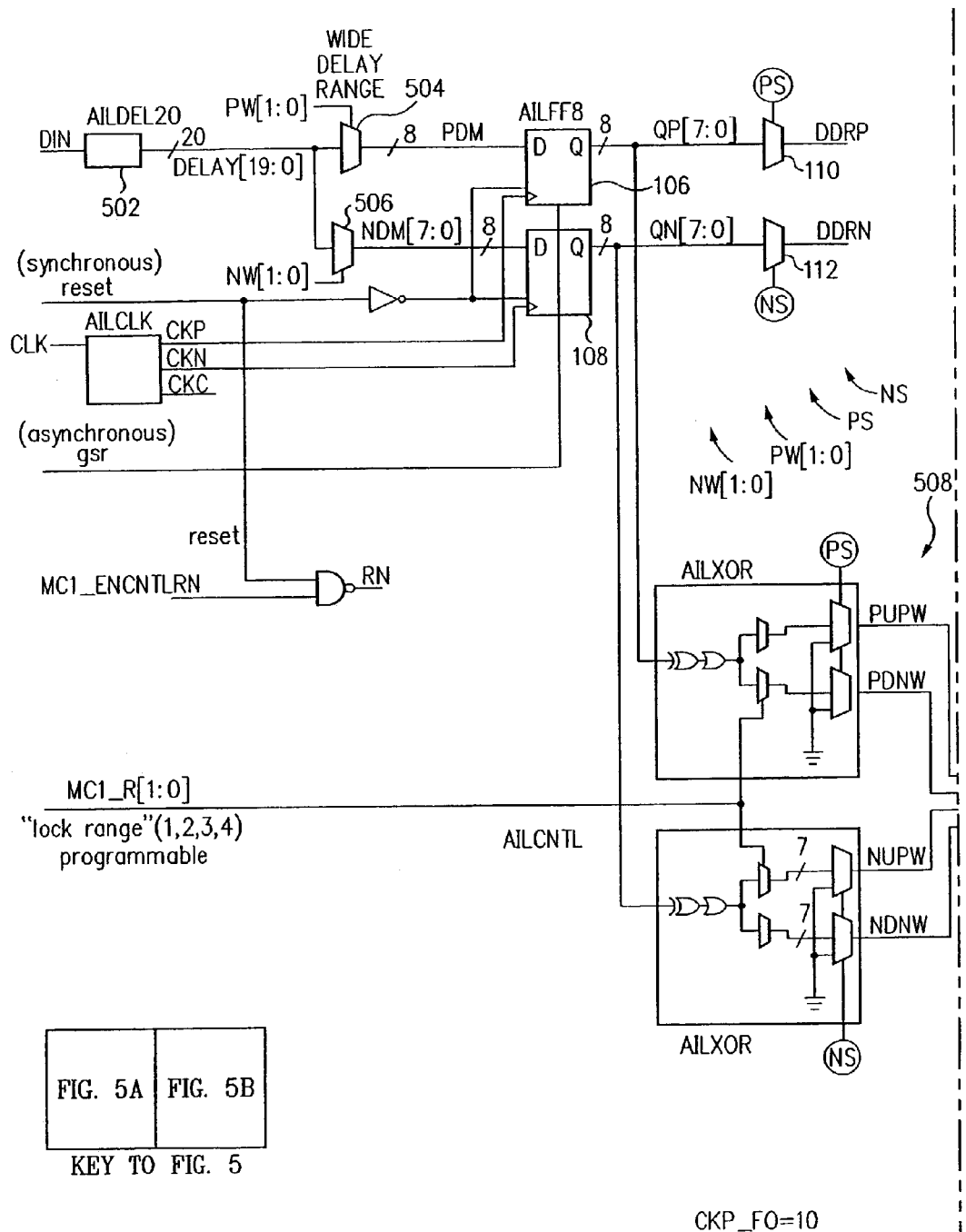
FIG. 5 shows an exemplary circuit implementation of the adaptive input logic in accordance with an embodiment of the present invention.
Figure 5B:
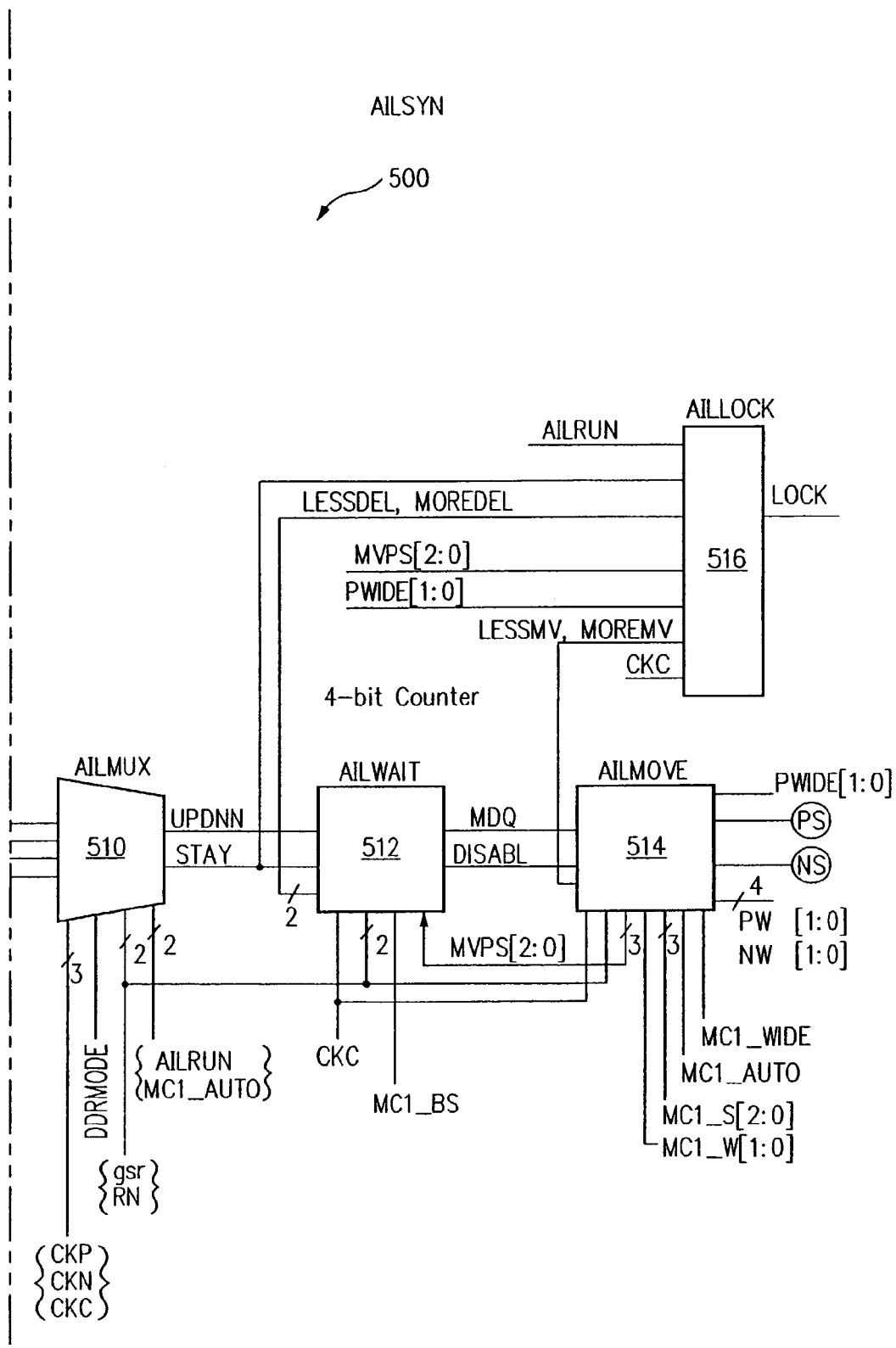

FIG. 5 shows an exemplary circuit implementation 500 of adaptive input logic 100 in accordance with an embodiment of the present invention. The data signal (labeled DIN) enters a delay element 502, which provides coarse and fine delay (i.e., includes coarse delay 102 and fine delay 104), with the amount of delay selectable by multiplexers 504 and 506 (corresponding to positive and negative clock edge data via respective PW[1:0] and NW[1:0] control signals) prior to capture by registers 106 and 108, respectively. The desired register bit from registers 106 and 108 is selected by multiplexers 110 and 112 via respective PS and NS control signals (note DDRP and DDRN labels correspond to DataP and DataN labels of FIG. 1).

Control logic 114 of FIG. 1 is represented by modules AILXOR 508, AILMUX 510, AILWAIT 512, AILMOVE 514, and AILLOCK 516 circuit blocks shown in FIG. 5. More specifically, the AILXOR and AILMUX circuit blocks may be viewed, for example, as performing substantially the functions of edge detector 302 and direction detector 304 of FIG. 3. The AILWAIT, AILMOVE, and AILLOCK circuit blocks may be viewed as corresponding to and performing substantially the functions of wait counter 306, move counter 308, and lock counter 310 of FIG. 3.

Figure 6:
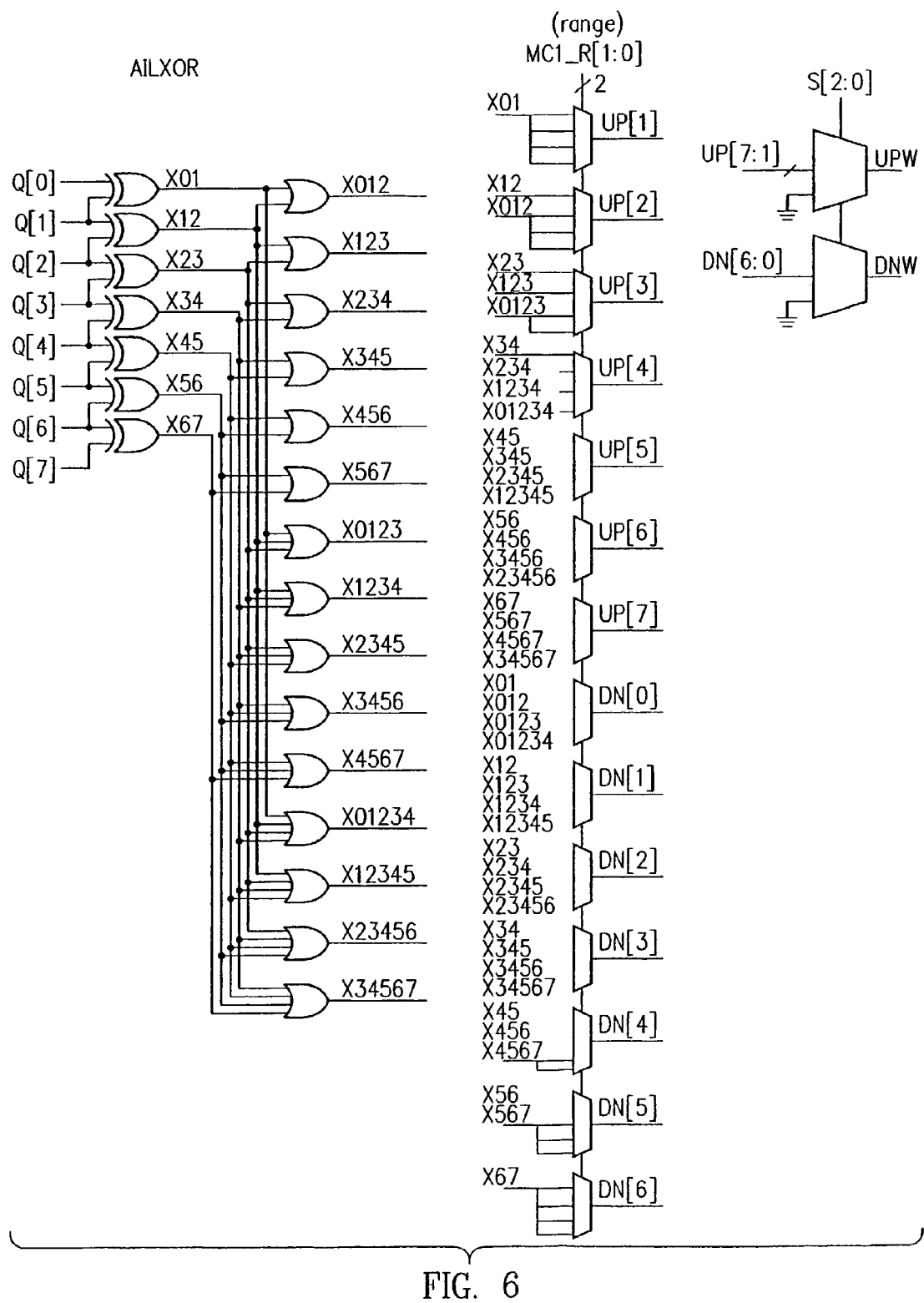
FIG. 6 shows an exemplary circuit implementation for an AILXOR portion of the adaptive input logic of FIG. 5 in accordance with an embodiment of the present invention.
Figure 7:
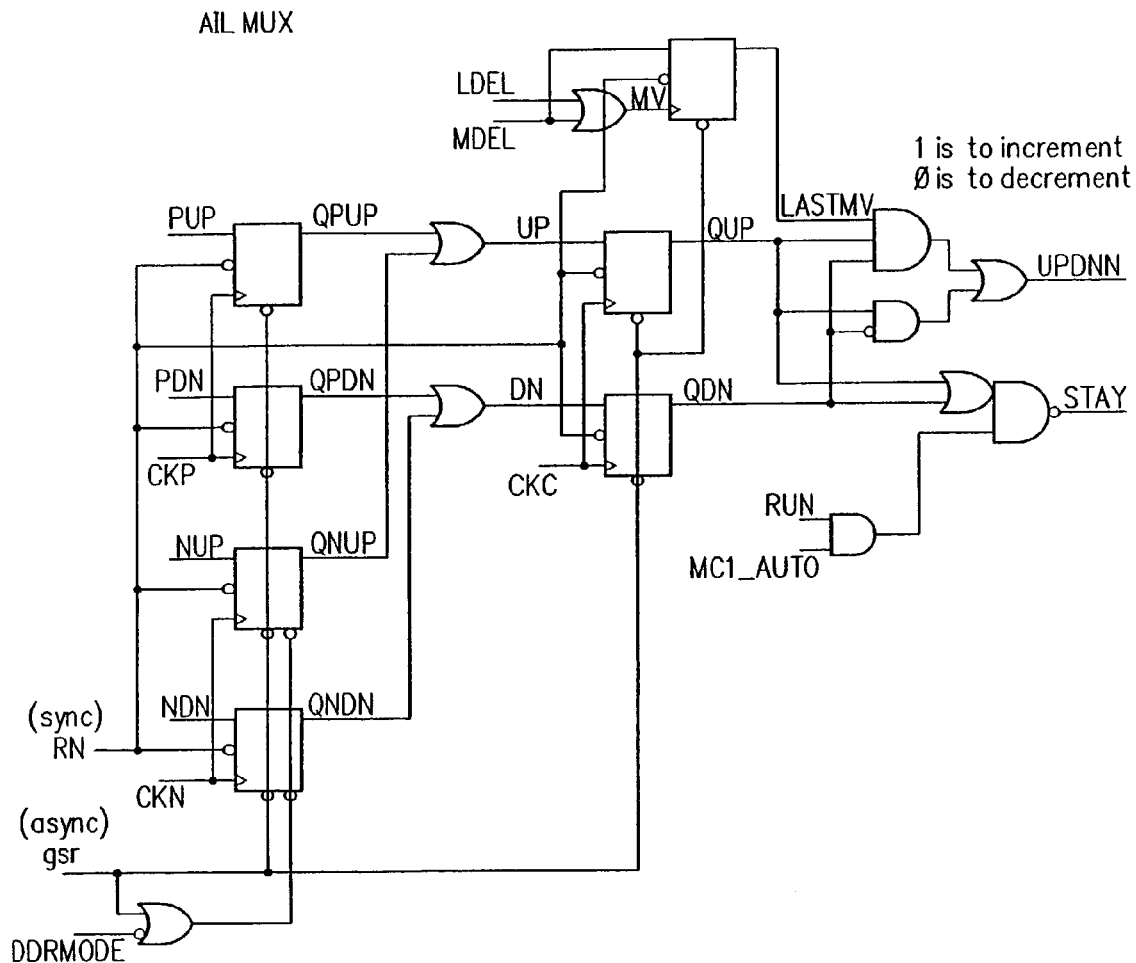
FIG. 7 shows an exemplary circuit implementation for an AILMUX portion of the adaptive input logic of FIG. 5 in accordance with an embodiment of the present invention.

FIG. 6 shows an exemplary specific circuit implementation for AILXOR 508 of the adaptive input logic circuit implementation of FIG. 5 in accordance with an embodiment of the present invention. FIG. 7 shows an exemplary specific circuit implementation for AILMUX 510 of the adaptive input logic circuit implementation of FIG. 5 in accordance with an embodiment of the present invention.

Figure 8:
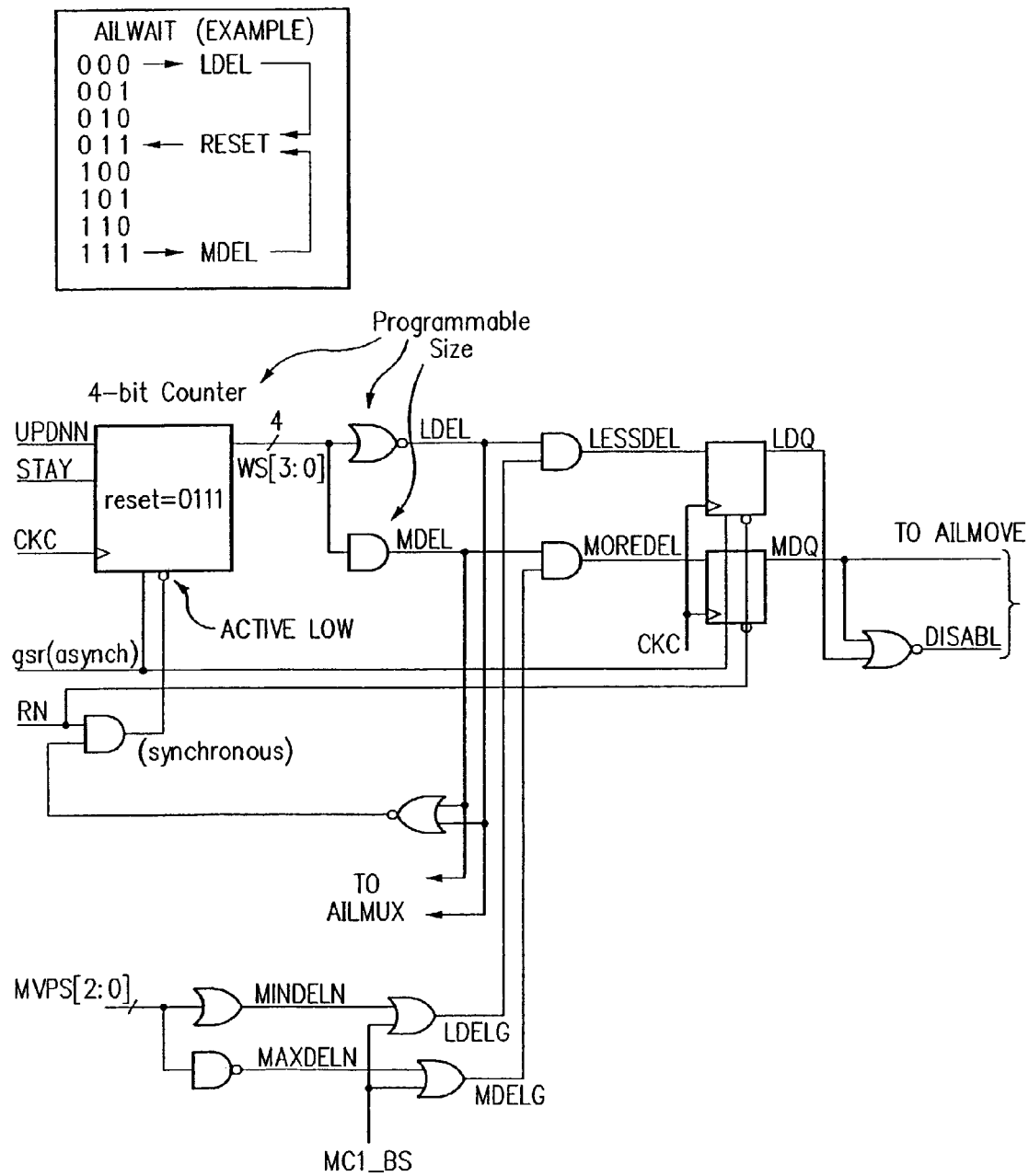
FIG. 8 shows an exemplary circuit implementation for an AILWAIT portion of the adaptive input logic of FIG. 5 in accordance with an embodiment of the present invention.
Figure 9A:
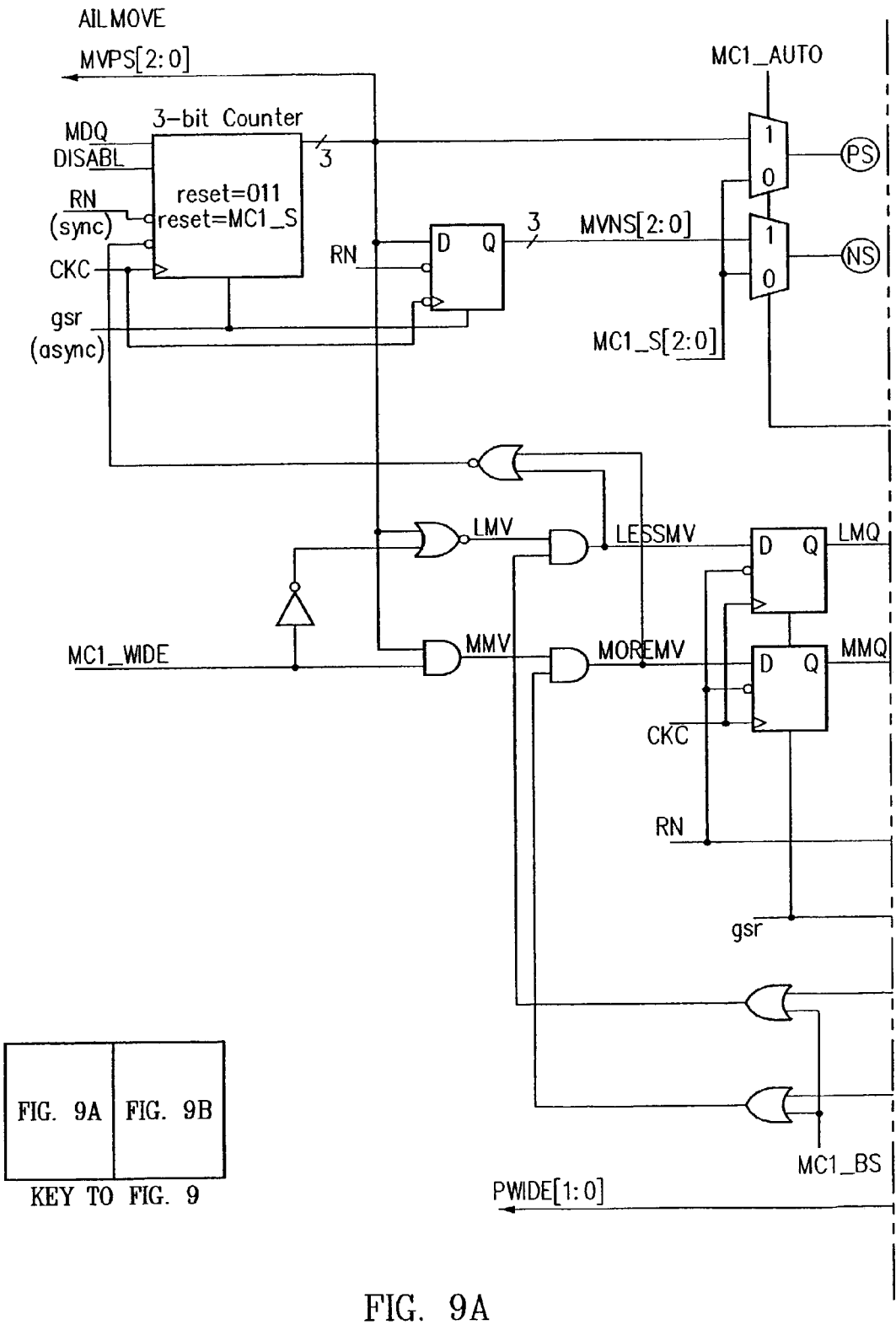
FIG. 9 shows an exemplary circuit implementation for an AILMOVE portion of the adaptive input logic of FIG. 5 in accordance with an embodiment of the present invention.
Figure 9B:
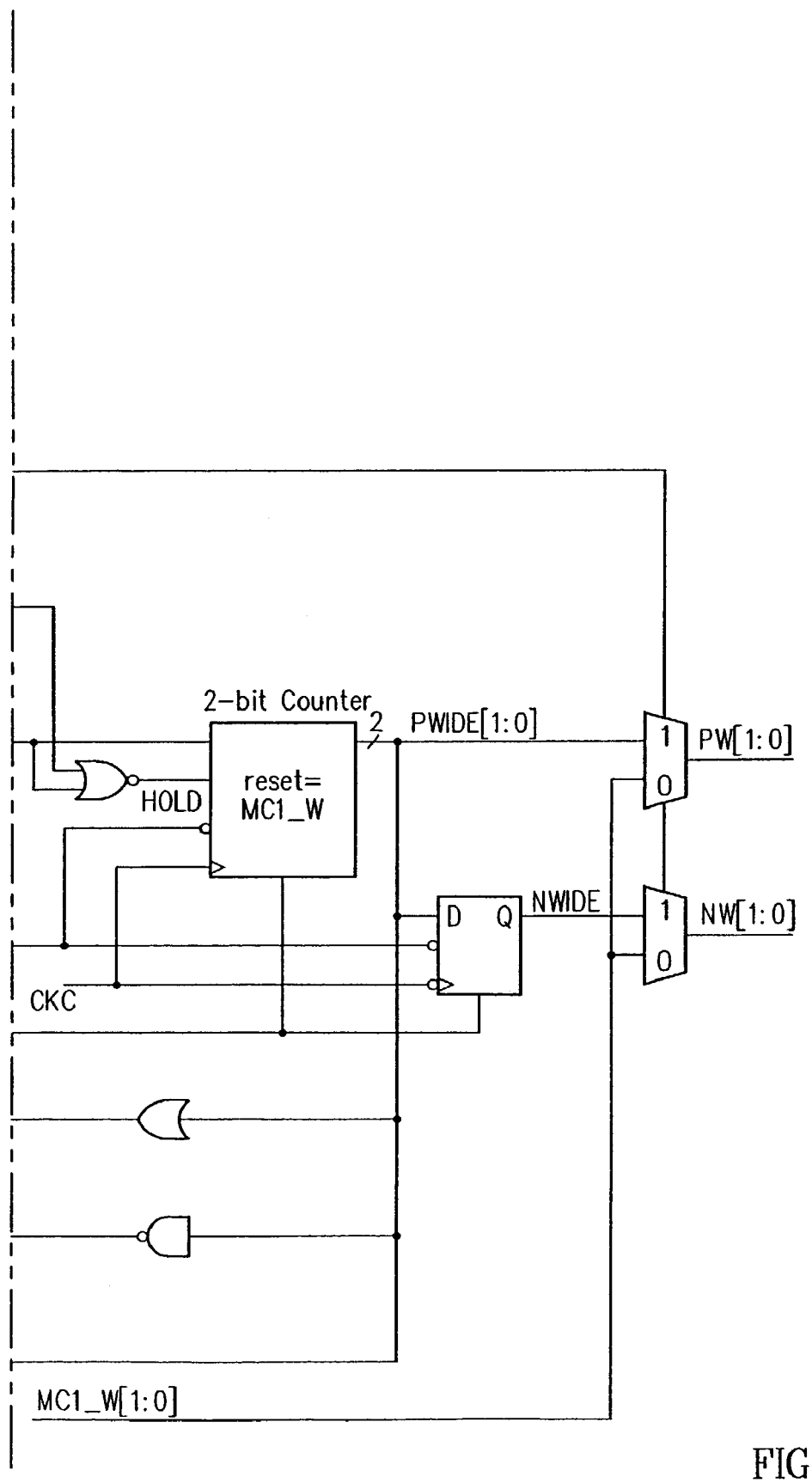
Figure 10:
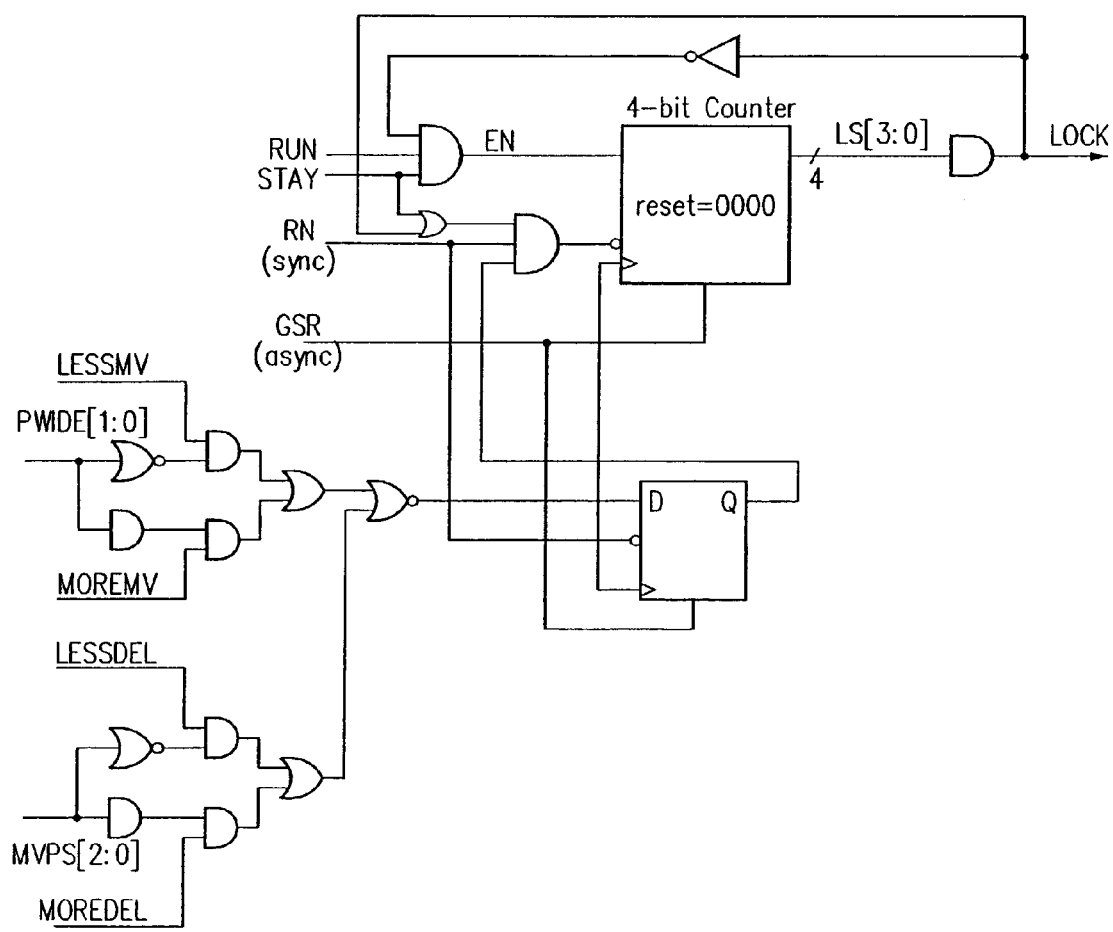
FIG. 10 shows an exemplary circuit implementation for an AILLOCK portion of the adaptive input logic of FIG. 5 in accordance with an embodiment of the present invention.

FIG. 8 shows an exemplary circuit implementation for AILWAIT 512 of the adaptive input logic circuit implementation of FIG. 5 in accordance with an embodiment of the present invention. FIG. 9 shows an exemplary circuit implementation for AILMOVE 514 of the adaptive input logic circuit implementation of FIG. 5 in accordance with an embodiment of the present invention. FIG. 10 shows an exemplary circuit implementation for AILLOCK 516 of the adaptive input logic circuit implementation of FIG. 5 in accordance with an embodiment of the present invention.

As integrated circuit performance requirements increase due to higher-speed performance requirements for I/O interface standards (e.g., FPGA I/O interface requirements) and the necessity to flexibly support numerous I/O interface standards, one or more embodiments of the present invention provide an improved system and method for capturing high-speed input data. For example, in accordance with one embodiment, integrated circuit (e.g., FPGA) setup and hold requirements for input data is reduced, a PLL or a DLL is not required to adjust the phase of an input clock, and input data from a given input pad can be adjusted independently.

The delay of the input data is adjusted rather than utilizing conventional techniques of selecting different phases of the clock, which may require difficult layout constraints and consume valuable circuit area and power due to the PLL having multiple clock signals and associated clock routing structure. Consequently, in accordance with some embodiments, all of the input data paths may be used for dynamic and static high-speed input paths without the requirements of numerous PLLs and corresponding clock routing structures typically associated with each I/O interface (e.g., a PLL allocated to each I/O interface standard with a given data rate and requiring clock phase adjustments).

One or more embodiments may be implemented as a generic I/O block to support numerous types of I/O interface standards by employing a self-adjusting delay technique for a data path. The positive and negative clock edges are monitored and the delay in the data path is adjusted to compensate for skew between the clock and data (e.g., SDR and DDR applications). The delay may be statically set and/or dynamically adjusted relative to a clock to maintain a data to clock phase relationship for each data path (e.g., on an individual pad basis). Furthermore, one or more embodiments are applicable for any type of clock distribution (e.g., generic or custom distribution scheme).

Embodiments described above illustrate but do not limit the invention. It should also be understood that numerous modifications and variations are possible in accordance with the principles of the present invention. Accordingly, the scope of the invention is defined only by the following claims.

We claim:

1. A circuit comprising:
   a delay circuit adapted to receive a first signal and apply a selectable delay to the first signal to provide a delayed first signal comprising a plurality of delayed versions of the first signal each simultaneously available from the delay circuit with a different delay and having a timing relationship relative to a clock signal;
   a first register, coupled to the delay circuit, adapted to receive the delayed first signal and the clock signal and store the delayed first signal based upon a timing of the clock signal;
   a first multiplexer coupled to the first register;
   a second register, coupled to the delay circuit, adapted to receive the delayed first signal and the clock signal and store the delayed first signal based upon a timing of the clock signal;
   a second multiplexer coupled to the second register; and
   a control circuit, coupled to the delay circuit, the first and second registers, and the first and second multiplexers, adapted to monitor the clock signal and the plurality of delayed versions of the first signal and determine the selectable delay to apply by the delay circuit and which of the plurality of delayed versions of the first signal, each having a different amount of delay, to select by the first multiplexer from the first register and provide as a first output signal and to select by the second multiplexer from the second register and provide as a second output signal.

2. The circuit of claim 1, wherein the delay circuit applies a coarse delay and a fine delay to the first signal and generates the delayed first signal comprising the plurality of delayed versions of the first signal, the first register adapted to store the plurality of delayed versions of the first signal.

3. The circuit of claim 1, wherein the control circuit selects one of the plurality of delayed versions of the first signal from the first register using the first multiplexer based on which of the register bits of the first register has had its setup and hold time requirements satisfied.

4. The circuit of claim 1, wherein the control circuit selects one of the plurality of delayed versions of the first signal from the first register using the first multiplexer and one of the plurality of delayed versions of the first signal from the second register using the second multiplexer based on which of the register bits of the first register and the second register has had its setup and hold time requirements satisfied.

5. The circuit of claim 1, wherein the first register stores the plurality of delayed versions of the first signal on a positive edge of the clock signal and the second register stores the plurality of delayed versions of the first signal on a negative edge of the clock signal.

6. The circuit of claim 5, wherein the first output signal or the second output signal is utilized for single data rate applications, while the first output signal and the second output signal are utilized for double data rate applications.

7. The circuit of claim 2, wherein the control circuit determines an amount of static delay and an amount of dynamic delay to apply for the coarse delay and the fine delay, respectively.

8. The circuit of claim 1, wherein the control circuit comprises:
   an edge detector adapted to determine a signal transition edge of the first signal relative to an edge of the clock signal;
   a direction detector, coupled to the edge detector, adapted to determine which of the plurality of delayed versions of the first signal to select;
   a wait counter, coupled to the direction detector, adapted to delay a selection of a different one of the plurality of delayed versions of the first signal; and
   a move counter, coupled to the wait counter, adapted to provide control signals to set the selectable delay and control the first and second multiplexer.

9. The circuit of claim 8, wherein the direction detector utilizes information regarding one or more previous determinations of the plurality of delayed versions of the first signal to assist in determining current or future selections from the plurality of delayed versions of the first signal.

10. The circuit of claim 8, wherein the move counter is utilized to set an amount of static delay or an initial delay setting for a dynamic delay.

11. The circuit of claim 8, further comprising a lock counter, coupled to the direction detector, the wait counter, and the move counter, adapted to provide a lock signal indicating that a minimum amount of margin has been met for a minimum duration of time.

12. The circuit of claim 11, wherein in the event that the lock signal is asserted by the lock counter, the lock signal remains asserted even though a selection of a different one of the plurality of delayed versions of the first signal may occur, but the lock counter deasserts the lock signal in the event that a bit swap occurs.

13. An integrated circuit comprising:
   means for delaying an input signal to provide simultaneously a plurality of delayed versions of the input signal with each having a different amount of delay applied, wherein the delaying means provides a coarse delay and a fine delay, with the fine delay having shorter delay intervals than can be provided by the coarse delay;
   means for storing the plurality of delayed versions of the input signal relative to a clock signal, wherein the storing means stores the plurality of delayed versions of the input signal relative to a positive edge and a negative edge of the clock signal; and means for controlling an amount of delay applied by the delaying means and determining which of the plurality of delayed versions of the input signal to provide as an output signal, wherein the controlling means determines the amount of delay applied by the delaying means based on a monitoring of the plurality of delayed versions of the input signal stored by the storing means and provides a static and a dynamic setting for the coarse delay and the fine delay.

14. The integrated circuit of claim 13, wherein the delaying means compensates for a delay of the clock signal through a clock distribution network.

15. The integrated circuit of claim 14, wherein the integrated circuit is a programmable logic device.

16. The integrated circuit of claim 15, wherein the controlling means is adapted to support single data rate and double data rate applications.

17. The integrated circuit of claim 13, wherein the controlling means is adapted to determine a state transition in the plurality of delayed versions of the input signal by monitoring the plurality of delayed versions of the input signal stored by the storing means.

18. A method of providing a timing relationship between an input signal and a clock signal, the method comprising:
  receiving the input signal;
  applying a selectable delay to the input signal to provide a delayed input signal comprising a plurality of delayed versions of the input signal each simultaneously available with a different delay and having a timing relationship relative to the clock signal;
  storing the delayed input signal based upon a timing of the clock signal on a positive edge and a negative edge of the clock signal; and
  determining a state transiton in the delayed input signal by monitoring the plurality of delayed versions of the input signal.

19. The method of claim 18, further comprising:
  monitoring the clock signal and the plurality of delayed versions of the input signal; and
  determining the selectable delay to apply and which of the plurality of delayed versions of the input signal, each having a different amount of delay, to select and provide as an output signal.

20. The method of claim 19, wherein the selectable delay comprises a coarse delay and a fine delay.

21. The method of claim 20, wherein the determining of which of the plurality of delayed versions of the input signal to select and provide as an output signal depends on which of the plurality of delayed versions of the input signal has had its setup and hold time requirements satisfied.

22. The method of claim 20, wherein the selectable delay comprises a static delay and/or a dynamic delay for the coarse delay and the fine delay.

* * * * *